United States Patent [19]

Kimura et al.

[11] 4,073,055
[45] Feb. 14, 1978

[54] METHOD FOR MANUFACTURING SEMICONDUCTOR DEVICES

[75] Inventors: Minoru Kimura, Kawasaki; Hiroyuki Tango; Yukio Ohmori, both of Yokohama, all of Japan

[73] Assignee: The President of the Agency of Industrial Science and Technology, Tokyo, Japan

[21] Appl. No.: 770,605

[22] Filed: Feb. 22, 1977

[30] Foreign Application Priority Data

Feb. 23, 1976 Japan .................................. 51-17911

[51] Int. Cl.² ......................................... H01L 21/302
[52] U.S. Cl. ...................................... 29/583; 29/576 E
[58] Field of Search ............. 29/569 R, 576 R, 576 E, 29/580, 583

[56] References Cited

U.S. PATENT DOCUMENTS

| 3,608,186 | 9/1971 | Hutson | 29/583 |
| 3,816,906 | 6/1974 | Falckenberg | 29/583 |
| 3,903,591 | 9/1975 | Wenzig et al. | 29/583 X |
| 3,965,568 | 6/1976 | Gooch | 29/583 |

Primary Examiner—Roy Lake
Assistant Examiner—E. F. Desmond
Attorney, Agent, or Firm—Flynn & Frishauf

[57] ABSTRACT

A method for the manufacture of semiconductor devices comprises the steps of forming a number of mutually electrically isolated semiconductor islands on an insulating substrate and cutting a semiconductor wafer, made of semiconductor elements and substrate, along its dicing line to provide a number of semiconductor chips, the method characterized in that additional semiconductor islands are formed on the insulating substrate simultaneously with, or after, the formation of the first-mentioned semi-conductor islands so that each substantially surrounds the chip. The method permits very easy mask alignments for photoengraving as well as a clear judgment as to whether or not the formation of contact openings has been completed.

10 Claims, 7 Drawing Figures (a)

(b)

(c)

METHOD FOR MANUFACTURING SEMICONDUCTOR DEVICES

BACKGROUND OF THE INVENTION

This invention relates to a method for manufacturing a semiconductor device, and particularly an IC device, having semiconductor elements formed on an insulating substrate.

An SOS (Silicon On Sapphire) structure is known as a preferred example of the above-mentioned IC structure. The SOS type is suitable for a high density integrated circuits, for it is easy to electrically classify semiconductor elements and the isolation of the semiconductor elements can be effected merely by selectively etching a silicon layer. In the SOS type integrated circuits, a stray capacitance between ground and connections made of aluminium and or poly-silicon and a capacitance on a pn junction are decreased by two orders of magnitude as compared with an ordinary integrated circuit (hereinafter referred to as an integrated circuit constructed of bulk silicon) in which semiconductor elements are formed in a silicon substrate. Thus, the SOS type is also fitted for a high-speed integrated circuit. The SOS type integrated circuit is generally formed as follows.

A number of electrically isolated semiconductor islands are formed on a sapphire substrate. Semiconductor elements are formed in the islands by means such as an impurity diffusion method, etc. A wafer made of the substrate and islands is diced to provide a number of chips. This method, however, presents difficulty in forming a contact opening for taking out a metal connection from the semiconductor element. Contact openings are formed by selectively removing a resist layer by photoetching and selectively etching a CVD (Chemical Vapor Deposition) oxide film or PSG (phosphosilicate glass) film on the silicon layer using ammonium fluoride, while using the remaining resist layer as a mask. In this case, a judgment as to whether or not the silicon layer is exposed by etching, i.e., whether or not the formation of the contact hole is completed is made as follows. That is, the silicon layer repels an ammonium fluoride solution without being wetted, while on the other hand the CVD film or the PSG layer present around the contact opening is intimately wetted with the ammonium fluoride solution. In many cases, the sapphire substrate exposed between the semiconductor elements is relatively intimately wetted with the solution. For this reason, the etching process is judged as complete when solution repellence is observed. Since, however, a number of very small contact openings (In the present design standard, for example, $6\mu m \times 6\mu m$) are present in the semiconductor wafer it is very difficult to judge the time at which the contact openings have been completed. This exerts a great influence over an LSI (Large Scale Integration) yield. In the LSI circuits, several thousands to several tens of thousands of contact openings are occupied in a single chip. The presence of a single defective contact opening results in a defective chip. With the advent of a high-density LSI circuit there is a tendency for the size of contact openings to be reduced to $4\mu m \times 4\mu m$ and further to $2\mu m \times 2\mu m$, Therefore, such a judging technique is more and more important in the fabrication of intergrated circuits. The other difficulty involved in the manufacture of SOS type integrated circuits resides in that much time is required in positioning a mask. In the method for fabricating integrated circuits comprised of a bulk silicon, a field oxide film is formed which has the feature of being easily distinguishable. The field oxide film is removed along dicing lines on a wafer and, in this case, the position of the dicing line is clearly indicated. The cutting line can be utilized as a mark in locating a mask and thus the mask alignment is easy to achieve. In the method for the manufacture of conventional SOS type integrated circuits, no field oxide film is formed and that surface portion of a sapphire substrate as will be marked with cutting lines is exposed or merely coated with a CVD oxide film. In consequence, it is difficult to provide clear dicing lines. Since the dicing line can not be utilized as a mark in the alignment of a mask, much time will be required in the mask alignment.

SUMMARY OF THE INVENTION

An object of this invention is to provide a method for the manufacture of semiconductor devices which permits a clear judgment as to whether or not the formation of contact openings for semiconductor elements has been completed.

Another object of this invention is to provide a method for the manufacture of semiconductor devices which permits easy mask alignment. According to this invention there is provided a method for manufacturing semiconductor devices which comprises the steps of forming on an insulating substrate first semiconductor regions corresponding to semiconductor elements and cutting a wafer, made of the semiconductor elements and substrate, along its dicing line to provide a number of semiconductor chips, the method characterized in that second semiconductor regions are formed on the insulating substrate simultaneously with, or after, the formation of said first semiconductor regions so that each substantially surrounds the chip. When contact holes for semiconductor elements are formed by etching, an insulating film on the second semiconductor region is simultaneously removed by said etching to expose the surface of the second region, the exposed surface of the second semiconductor region being utilized to judge whether or not the formation of said contact holes has been completed. The second semiconductor region can be utilized as a mark in effecting a mask alignment, and may be formed continuously or discontinuously around the semiconductor chip. The first and second semiconductor regions may be formed of either a single crystal silicon or a polycrystalline silicon. If the first and second semiconductor regions are formed in an independent step on the insulating substrate, the first region may be formed of a single crystal silicon and the second region a polycrystalline silicon. Alternatively, the first region may be formed of a polycrystalline silicon and the second region a single crystal silicon. If each region is formed of a single crystal, it has a thickness of, preferably 0.2 to $1.2\mu$. If on the other hand each region is formed of a polycrystalline silicon it has a thickness of, preferably, 0.1 to $1\mu$. It is not necessarily required that the first and second regions have the same thickness.

BRIEF DESCRIPTION OF THE DRAWING

This invention will be further described by way of example by referring to the accompanying drawings in which.

DESCRIPTION OF THE PREFERRED EMBODIMENT

Figure 1:
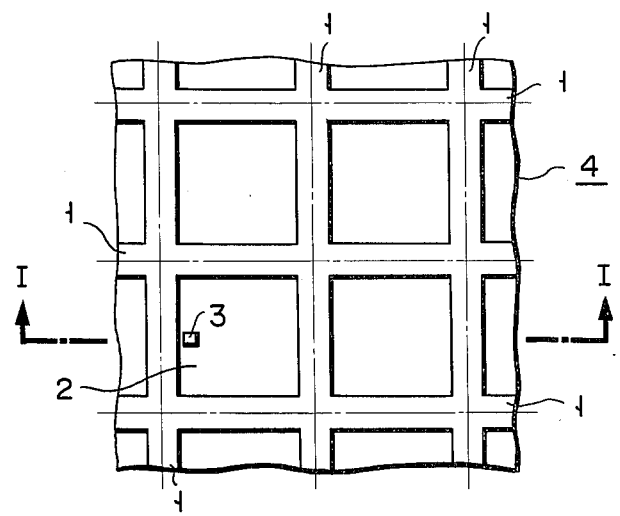
FIG. 1(a) is an enlarged plan view showing a major part of an SOS type wafer according to one embodiment of this invention.
FIG. 1(b) is a cross-sectional view, as taken along line I—I, showing the SOS type wafer on which a CVD film is formed.
FIG. 1(c) is a cross-sectional view, as taken along line I—I, showing the SOS type wafer in which contact openings are formed.
Figure 1:
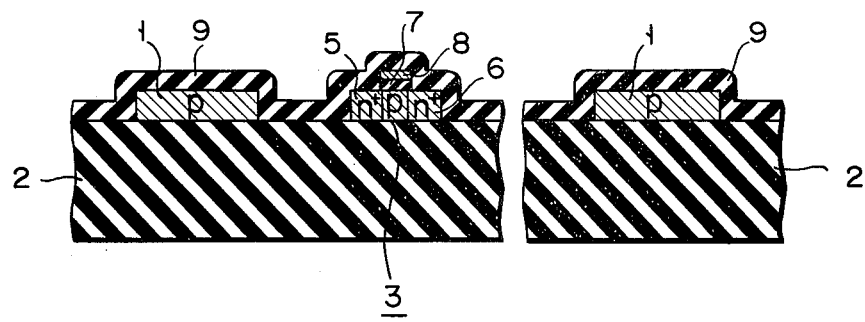
Figure 1:
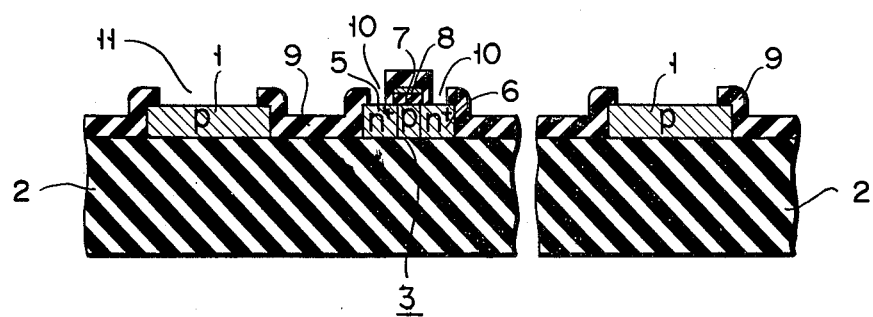

FIG. 1 is a plan view showing a semiconductor wafer manufactured according to the method of this invention. In FIG. 1 (a) a p-type silicon layer 1 is formed in lattice-like pattern on a sapphire substrate 2 and constitutes together with the sapphire substrate 2 an SOS type wafer 4. A number of mutually isolated p-type silicon islands 3 (for convenience only one island is shown in FIGS. 1 (b) and (c) are formed in each square region around the lattice-like p-type silicon layer and the square regions are surrounded with the lattice-like p-type silicon layer 1 and each constitute a semiconductor chip which is cut along a dicing line on the semiconductor region at a later step. A dot-dash line in FIG. 1 (a) indicates dicing lines on the SOS type wafer. FIG. 1 (b) is a cross-sectional view, taken along line I—I in FIG. 1 (a), showing an SOS type wafer on which a CVD oxide film is formed, the wafer including islands formed by a usual method. In FIG. 1 (b) a p-type single crystal silicon layer is epitaxially grown on the whole surface of the sapphire substrate 2. The single crystal silicon layer is selectively etched to provide a lattice-like silicon layer 1 and p-type silicon islands 3. A semiconductor element formed in each island 3 may be a silicon-gate MOS transistor as shown in FIG. 1 (b). The transistor is formed by diffusing an n-type impurity into the p-type island 3 and includes an n$^+$ source region 5, n$^+$ drain region 6, a gate oxide film 7 formed on the surface of the island and a poly-Si gate electrode 8. After the formation of the semiconductor element a CVD oxide film 9 is coated on the resultant SOS type wafer. FIG. 1 (c) is a cross-sectional view, as taken along line I—I in FIG. 1 (a), showing the formation of contact holes for electrodes. The contact holes are formed by selectively etching the CVD oxide film 9 with an ammonium fluoride etching solution using a mask, not shown, made of photoresist to expose the source and drain regions 5 and 6. As will be evident from FIG. 1 (c) the CVD oxide film 9 on the surface of the lattice-like silicon layer 1 is etched away, simultaneously with the formation of the contact holes, to expose most of the surface of the lattice-like silicon layer 1, i.e., form a wide opening 11. The opening 11 is much greater in area than each contact opening. Since the exposed surface of the lattice-like silicon layer 1 repels the etching solution, i.e., is not wetted with the etching solution, whether or not the formation of the contact openings has been completed is judged by solution repellence occuring at the exposed surface of the lattice-like silicon layer 1. The lattice-like silicon layer 1 surrounding the chip can be effectively utilized as a mark for mask alignment. The SOS type wafer can be easily cut along the dicing line using a laser scriber, blade cutter, etc. In FIG. 1 (a) to (c) the same reference numerals are used to designate the same parts or elements.

Figure 2:
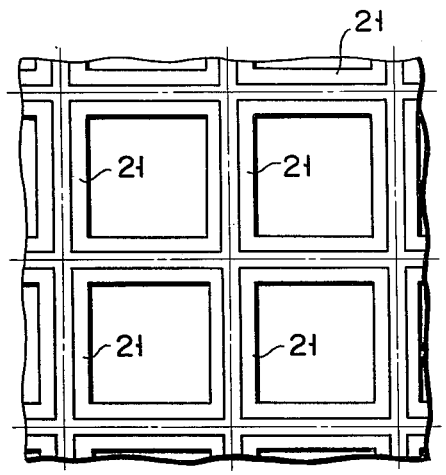
FIG. 2-4 are enlarged, views each showing a SOS type wafer according to another embodiment of this invention.
Figure 3:
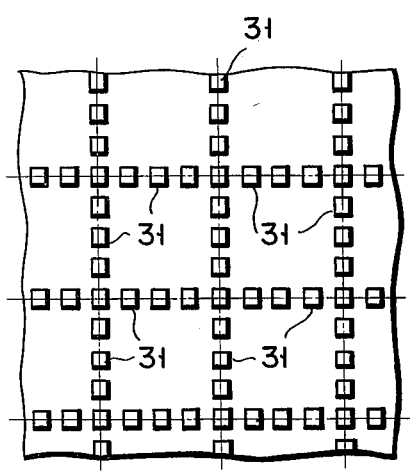
Figure 4:
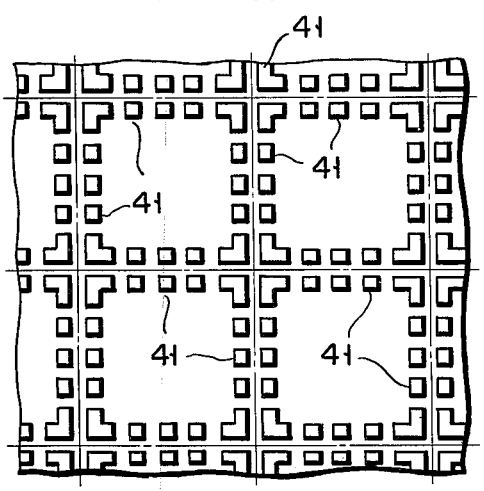
Figure 5:
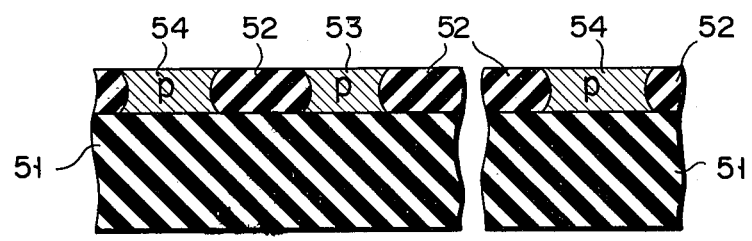
FIG. 5 is a cross-sectional view showing a modified semiconductor device in which first and second semiconductor regions are simultaneously formed on an insulating substrate.

FIG. 2 to 4, each, show a SOS type wafer showing a modified lattice-like silicon layer 1. In the embodiment shown in FIG. 1 (a) the dicing line is covered with the lattice-like silicon layer 1 which surrounds the chip. In the wafer in FIG. 2, on the other hand, a lattice-like silicon layer 21 corresponding to the outer frame or margin of each chip is located at each side of each dicing line and not on the dicing line. In FIG. 4 a silicon layer 41 is intermittently not continuously, formed substantially around a semiconductor chip and in FIG. 3 a silicon layer 31 is intermittently formed in lattice-like like pattern on dicing lines on a substrate and substantially corresponds to a pattern as obtained by intermittently cutting away the silicon layer 1 shown in FIG. 1 (a). Since in the SOS type wafer as shown in FIG. 2 and 4 no dicing line is marked on the silicon layer, the wafer can be cut by a diamond stylus along the dicing line without producing any silicon cutting chips. In the embodiments shown in FIGS. 1 to 4 mutually isolated first and second semiconductor regions are formed by selectively etching the silicon layer on the substrate. However, the first and second semiconductor regions may be formed through selective etching. In an SOS type wafer shown in FIG. 5, for example, a p-type silicon layer is epitaxially grown on a sapphire substrate and selectively oxidized to provide SiO$_2$ layers 52 through which first and second silicon layers 53 and 54 are isolated from each other. The first silicon layer 53 constitutes a semiconductor element in a later step and the second silicon layer 54 is formed around each chip and indicates the position of cutting lines. In FIG. 5, a probe can be applied to the surface of mutually isolated adjacent second silicon layer 54 for conducting tests. In this case, whether or not semiconductor elements are completely insulated from each other can be checked without damaging the surface of the first semiconductor elements 53.

Although in the above-mentioned embodiment sapphire is used as a material for an insulating substrate, any other materials such as spinel, SiO$_2$ etc. may be used. Use may also be made of a lamination of a SiO$_2$ layer and poly-Si layer, or a lamination of a single crystal silicon layer and SiO$_2$ layer.

What we claim is:

1. A method for manufacturing semiconductor devices, comprising the steps of
   a. selectively forming first and second semiconductor regions on an insulating substrate, said first semiconductor region constituting a semiconductor element in a later step and said second semiconductor region being formed in a manner to substantially surround a semiconductor chip which is cut away from a semiconductor wafer along its dicing line in a later step;
   b. forming said semiconductor element on said first semiconductor region; and
   c. cutting said semiconductor chip away from said semiconductor wafer along the dicing line marked on said second region.

2. The method according to claim 1, in which after a semiconductor layer is formed on an insulating substrate said first and second regions are formed by selectively removing the semiconductor layer on the insulating substrate.

3. The method according to claim 1, in which after said first semiconductor region is formed on the substrate, said second region is formed on the substrate in another step.

4. The method according to claim 1, in which a silicon layer formed on the insulating substrate is selectively oxidized to provide an isolating region through which said first and second regions are formed on the insulating substrate.

5. The method according to claim 1, in which, when contact openings for the semiconductor element is formed by etching, an insulating layer on the surface of said second semiconductor region is removed by said etching to expose the surface of said second semiconductor region, the exposed surface of said second semiconductor region being utilized to judge whether or not the formation of said contact openings has been completed.

6. The method according to claim 1, in which said second semiconductor region is continuously formed around the semiconductor chip.

7. The method according to claim 1, in which said second semiconductor region is intermittently formed around the semiconductor chip.

8. The method according to claim 1, in which said first semiconductor region is formed of one kind selected from the group consisting of single crystal silicon and polycrystalline silicon.

9. The method according to claim 1, in which said second semiconductor region is formed of one kind selected from the group consisting of single crystal silicon and polycrystalline silicon.

10. The method according to claim 1, in which said insulating substrate is a sapphire substrate.

* * * * *